(12) United States Patent
Chen et al.

(10) Patent No.: US 8,022,701 B2
(45) Date of Patent: Sep. 20, 2011

(54) METHOD AND APPARATUS FOR SIMULTANEOUSLY ACQUIRING MULTIPLE SLICES/SLABS IN MAGNETIC RESONANCE SYSTEM

(75) Inventors: Jyh-Horng Chen, Taipei (TW); Tzi-Dar Chiueh, Taipei (TW); Edzer L. Wu, Taipei (TW); Li-Wei Kuo, Taipei (TW)

(73) Assignee: National Taiwan University, Taipei (TW)

( * ) Notice: Subject to any disclaimer, the term of this patent is extended or adjusted under 35 U.S.C. 154(b) by 300 days.

(21) Appl. No.: 12/337,388

(22) Filed: Dec. 17, 2008

(65) Prior Publication Data

US 2009/0278538 A1    Nov. 12, 2009

(30) Foreign Application Priority Data

May 7, 2008   (TW) ............................... 97116790 A
Aug. 7, 2008  (TW) ............................... 97130053 A

(51) Int. Cl.
     *G01V 3/00*   (2006.01)
(52) U.S. Cl. ...................................................... 324/309
(58) Field of Classification Search .......... 324/300–322; 600/410–435
     See application file for complete search history.

(56) References Cited

U.S. PATENT DOCUMENTS

| | | | | |
|---|---|---|---|---|
| 5,298,861 A * | 3/1994 | Sugimoto | ...................... | 324/306 |
| 5,345,172 A * | 9/1994 | Taguchi et al. | ............... | 324/309 |
| 5,786,692 A * | 7/1998 | Maier et al. | .................... | 324/307 |
| 6,486,669 B1* | 11/2002 | Sinkus et al. | .................... | 324/307 |
| 6,853,190 B2* | 2/2005 | Nittka et al. | .................... | 324/309 |
| 6,980,001 B2* | 12/2005 | Paley et al. | .................... | 324/318 |
| 7,723,987 B2* | 5/2010 | Bito et al. | ...................... | 324/309 |
| 2009/0085563 A1* | 4/2009 | Bito et al. | ...................... | 324/307 |

OTHER PUBLICATIONS

Paley et al., "Simultaneous Parallel Inclined Readout Image Technique", Magnetic Resonance Imaging 24 (2006) p. 557-562.
Weaver, John B., "Simultaneous Multislice Acquisition of MR Images", Magnetic Resonance in Medicine 8, (1988) p. 275-284.

* cited by examiner

*Primary Examiner* — Dixomara Vargas
(74) *Attorney, Agent, or Firm* — Schmeiser, Olsen & Watts LLP

(57) ABSTRACT

Provided is a method for simultaneously acquiring magnetic resonance slices/slabs of a subject. The method comprises steps as follows. First, apply one or more than one RF pulse, which carries at least two frequency components, and a slice/slab selection magnetic field gradient so that at least two slices/slabs of the subject respectively corresponding to the at least two frequency components are excited simultaneously. Second, apply a spatial encoding magnetic field gradient. Third, apply a slice/slab separation magnetic field gradient so as to separate the at least two slices/slabs. The method according to the present invention can be used to acquire data for simultaneously reconstructing multiple slices/slabs. The method is compatible with existing MRI systems.

19 Claims, 13 Drawing Sheets

METHOD AND APPARATUS FOR SIMULTANEOUSLY ACQUIRING MULTIPLE SLICES/SLABS IN MAGNETIC RESONANCE SYSTEM

BACKGROUND OF THE INVENTION

1. Field of the Invention

The present invention relates to a method and an apparatus for magnetic resonance (MR) system, particularly for simultaneously acquiring multi-slice/slab magnetic resonance imaging (MRI) signals.

2. Description of the Prior Art a. Principle of Two-Dimensional Magnetic Resonance Imaging The principle of two-dimensional (2D) MRI procedure is described as follows: As a subject is placed in a static magnetic field, a region of the subject can be excited by using a radio-frequency (RF) coil and giving signals with respect to all the excitation and relaxation of nucleus excitations and relaxations in the region. With a (magnetic) gradient applied, the RF coil can receive those signals, which can be processed to a MR image. If the change in the structure or functionality of the region is to be realized, the gradient may be adjusted so that slices can be acquired from various locations in the region.

In the following, 2D spatial encoding is described. In the beginning, a slice-selection gradient $G_Z$ is turned on and a slice normal to the Z-direction is excited by RF pulses with suitable frequencies. A phase-encoding gradient $G_Y$ is then turned on for a period of time and then is turned off, so that those nuclei have a certain phase difference in the Y-direction. As a result, a frequency-encoding gradient $G_X$ is turned on, while starting to receive signals. Due to this phase difference, the sum of signals with different frequencies (in the X-direction) is received, giving a line in a space spanned by two variables, i.e., the phase difference and the frequency. This space is termed the k-space. A similar procedure may be repeated, where the phase-encoding gradient $G_Y$ is changed and thus those nuclei have another certain phase difference in the Y-direction. At this phase difference, the sum of signals with different frequencies (in the X-direction) is received, giving another line in the k-space. The whole sampling in the k-space is completed as the sums of signals with different frequencies are received at different phase differences. When the phase difference is changed, the slice-selection gradient $G_Z$ is turned on to excite the selected slice.

A 2D Fourier transform is performed after the k-space sampling is completed. That is, the phase differences and the frequencies are transformed into signal intensities at locations on the XY-plane, forming an image of a horizontal slice or a slab. Thus, a 2D MR image is made.

b. Principle of Three-Dimensional Magnetic Resonance Imaging

The principle of the 3D MRI is similar to that of the 2D MRI, except for a difference in the spatial encoding. A phase-encoding gradient $G_Y$ and a slab-selection gradient $G_Z$ are turned on for a period of time and then are turned off, so that those nuclei have certain phase differences in the Y-direction and Z-direction. A similar procedure may be repeated, where the phase-encoding gradient $G_Y$ and the slab-selection gradient $G_Z$ are changed. A 3D Fourier transform is performed after the k-space sampling is completed, giving a 3D MR image.

c. Common Drawback of Two or Three-Dimensional Magnetic Resonance Images

Referring to FIG. 1, in a conventional procedure of 2D spatial encoding, only one single slice of the subject can be processed at a time; that is, multi-slice images are acquired from multiple scans along a scan direction. Therefore, one image is obtained from one scan; N image is obtained from N scan. The time required for acquiring the images of all the slices can be calculated as Equation 1 (Eq. 1).

Time required for acquiring the images of all the slices $$= NEX \times N_{pe} \times TR \times N_{slice}, \quad \text{(Eq. 1)}$$

where NEX denotes the average number of signaling and $N_{pe}$ is the whole number of encoding. For the 2D MR image, $N_{pe}$ denotes the number of phase encoding $N_p$, TR denotes the time required for acquiring a line in the k-space, and $N_{slice}$ denotes the number of the slices. For example, if there are total 256 images to be acquired, then $N_{slice}=256$, NEX=1, $N_{pe}=128$, TR=0.1 second, and the time required for acquiring the images of all the slices is about 54 minutes. This is therefore a time-consuming procedure.

Referring to FIG. 2, in a conventional procedure of 3D spatial encoding, in one scan only one single slab of the subject can be excited to give the images of all the slices. Also, the time required for acquiring the 3D MR is calculated as Eqn. 1, but the whole number of encoding $N_{pe}$=the number of phase encoding $N_p \times$ the number of phase encoding $N_Z$. Thus, it is apparent that more time is required for acquiring the 3D MR image.

d. Other Related Techniques

MRI is a useful tool for biomedical applications to obtain real-time images. Any possible method to accelerate the MRI scan time is highly attractive. Thus, a great deal of manpower and resources have been invested in this research field, resulting in the development of various ways of acceleration such as simultaneous excitation-time division multiple acquisition, phased array coil acceleration, and reduction in data reception.

The following list some of the approaches developed to date:

i. Simultaneous multi-slice acquisition of MR images by Hadamard encoded excitation (called SIMA sequence for short). Multiple slices are excited simultaneously, but a composite image of the multiple slices is received. The characteristic of the RF electromagnetic wave excited from each slice is required for solving a certain polynomial to give the complete information of an individual image. This technique has the disadvantage that extra time for computation may be needed and that N excitations and N receptions are required for computing the information of N slices.

ii. Simultaneous parallel inclined readout image technique (called SMA sequence for short). In this approach, multiple slices are excited simultaneously, and in receiving, different magnetic field intensities are applied to different slices by means of the gradient coil. This technique has the disadvantage that the additional gradient coil may result in inevitable blur in the image and may thus reduce the image quality.

iii. Use of multi-coil array for the separation of signals from multiple slices simultaneously excited (called SENSE sequence for short). In this approach, the images of different slices are received simultaneously using the sensitivity difference of multiple coils at different locations. The real images with respect to different locations are then computed. This technique has the disadvantage that extra coils are needed; for example, four times acceleration requires at least four coils. The acceleration effect is not proportional to the amount of coils.

iv. MAMBA. One stepped gradient coil is added, besides common linear gradient coils, so that the images of different slices have different resonant frequencies. This technique has the disadvantage that extra coils are needed (MAMBA gradient coils) and the acceleration factor and the multi-slice pitch are unchanged due to the fact that the coils cannot be arbitrarily adjusted.

Therefore, whether simultaneous excitation-time division multiple acquisition or phased array coil acceleration is used, conventional multi-slice image processing techniques cannot, at several times acceleration, simultaneously excite and acquire multi-slice, real-time images under the same pulse time-sequence without adding coils or computation algorithms, or reducing the acquired data. Moreover, these conventional multi-slice/slab MR image processing techniques require additional costs for adding coils or computation algorithms.

SUMMARY OF THE INVENTION

A method for simultaneously acquiring multi-slice/slab MRI signals from a subject is describer herein.

In one aspect, a method for simultaneously acquiring multi-slice/slab MRI signals comprises steps of: (a) applying one or more than one RF pulse, which carries at least two frequency components, and a slice/slab selection gradient so that at least two slices/slabs of the subject respectively corresponding to the at least two frequency components are excited simultaneously; (b) applying a spatial encoding gradient; and (c) applying a slice/slab separation gradient for separating at least two slices/slabs.

In another aspect, an apparatus for simultaneously acquiring multi-slice/slab MRI signals from a subject is capable of imaging by generating a MRI signal from the subject and by reducing the MRI signal to spatial encoding data with respect to each slice/slab of the subject. The apparatus comprises an RF excitation module, an RF receiving module, a gradient output module, and a sequence controller for controlling the activation of those modules.

The sequence controller may be used for controlling the RF excitation module, the gradient output module and the RF receiving module, so as to perform the method for simultaneously acquiring multi-slice/slab MRI signals. It comprises steps of controlling the subject.

The RF excitation module may be controlled and used for applying to the subject one or more than one RF pulse, which carries at least two frequency components, so that at least two slices/slabs of the subject respectively corresponding to at least two frequency components are excited simultaneously. The gradient output module may be controlled and used for applying to the subject of a spatial encoding gradient, a slice/slab selection gradient, and a slice/slab separation gradient for separating the at least two slices/slabs. The RF receiving module may be controlled and used for receiving the MRI signal excited from the subject.

In still another aspect, a method for simultaneously acquiring multi-slice/slab MRI signals from a subject, the method being capable of imaging a slice/slab of a subject, comprises the steps of: (a) applying one or more than one RF pulse, which carries at least two frequency components, and a slice/slab selection gradient so that at least two slices/slabs of the subject respectively corresponding to at least two frequency components are excited simultaneously; (b) applying a spatial encoding gradient; and (c) applying a slice/slab separation gradient, which may be used for separating at least two slices/slabs, and receiving the MRI signal excited from the subject; and (d) reconstructing the MRI signal by performing spatial encoding and 2D Fourier transform, so as to give the real-time image of each slice/slab.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DESCRIPTION OF THE PREFERRED EMBODIMENT

In the following description, at first it will be noted that similar elements are denoted by the same numbers and, for the purpose of convenience, the symbol "/" means "or". In addition, the coordinate (X, Y, Z) is used with respect to the coordinate of images but is not an absolute spatial coordinate about the MRI system.

The methods and apparatus described herein make it possible to simultaneously excite and acquire MR images of different locations in the subject. These embodiments are compatible with a variety of existing MRI systems. Moreover, they do not require extra coils/RF channels and extra time for computation of image information and extra computer equipment. The embodiments described herein can be applied to MRI systems by means of echo planar imaging, perfusion, image flow, angiogram, image temperature, T1 imaging (lattice-spin relaxation time constant), T2 imaging (spin-spin relaxation time constant), diffusion and the like.

Figure 1:
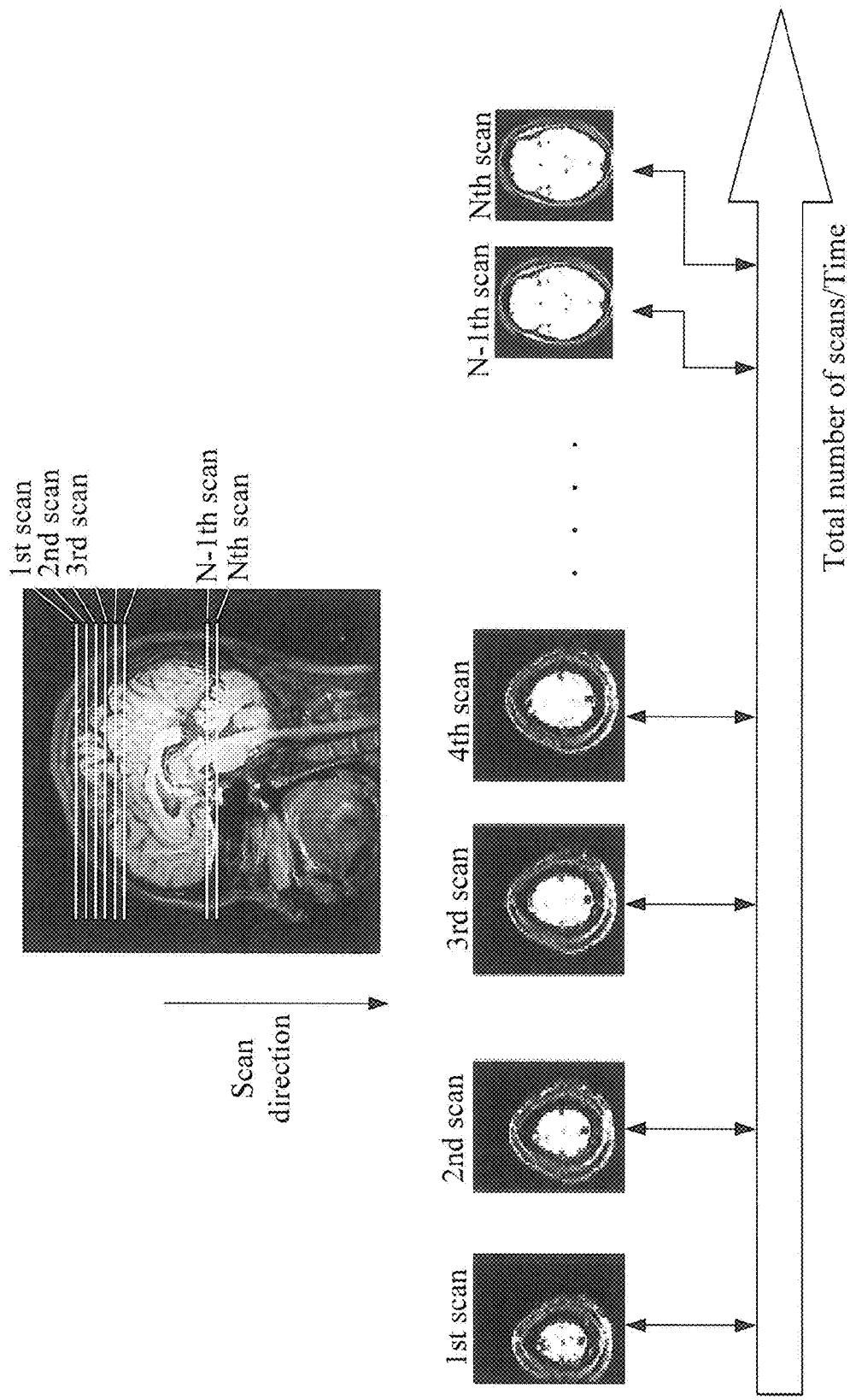
FIG. 1 is a schematic diagram, showing that, in a conventional procedure of 2D spatial encoding, only one single slice of the subject can be processed at a time and N images are given at N scans.
Figure 2:
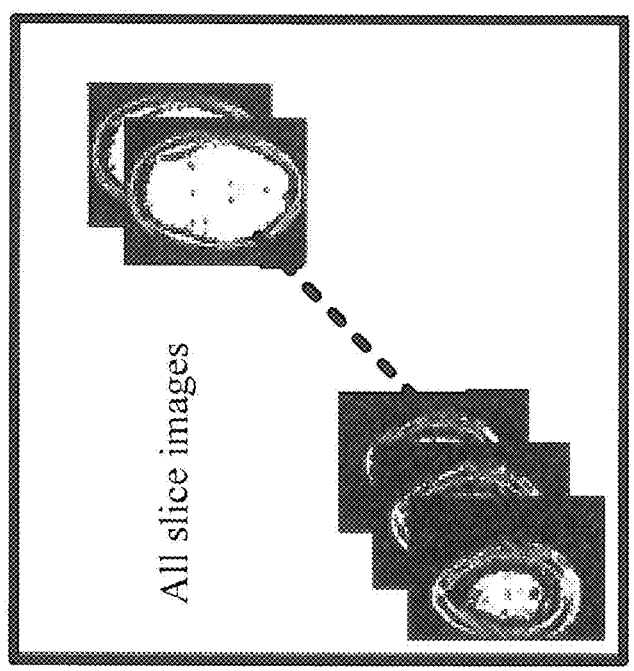
FIG. 2 is a schematic diagram, showing that, in a conventional procedure of 3D spatial encoding, only one single slab of the subject can be excited to give N images.
Figure 2:
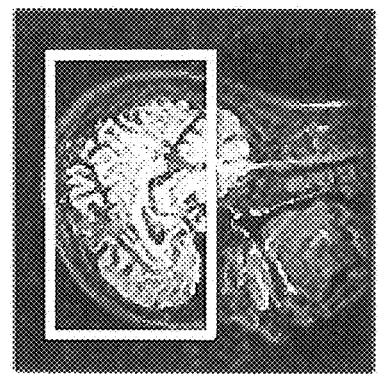
Figure 3:
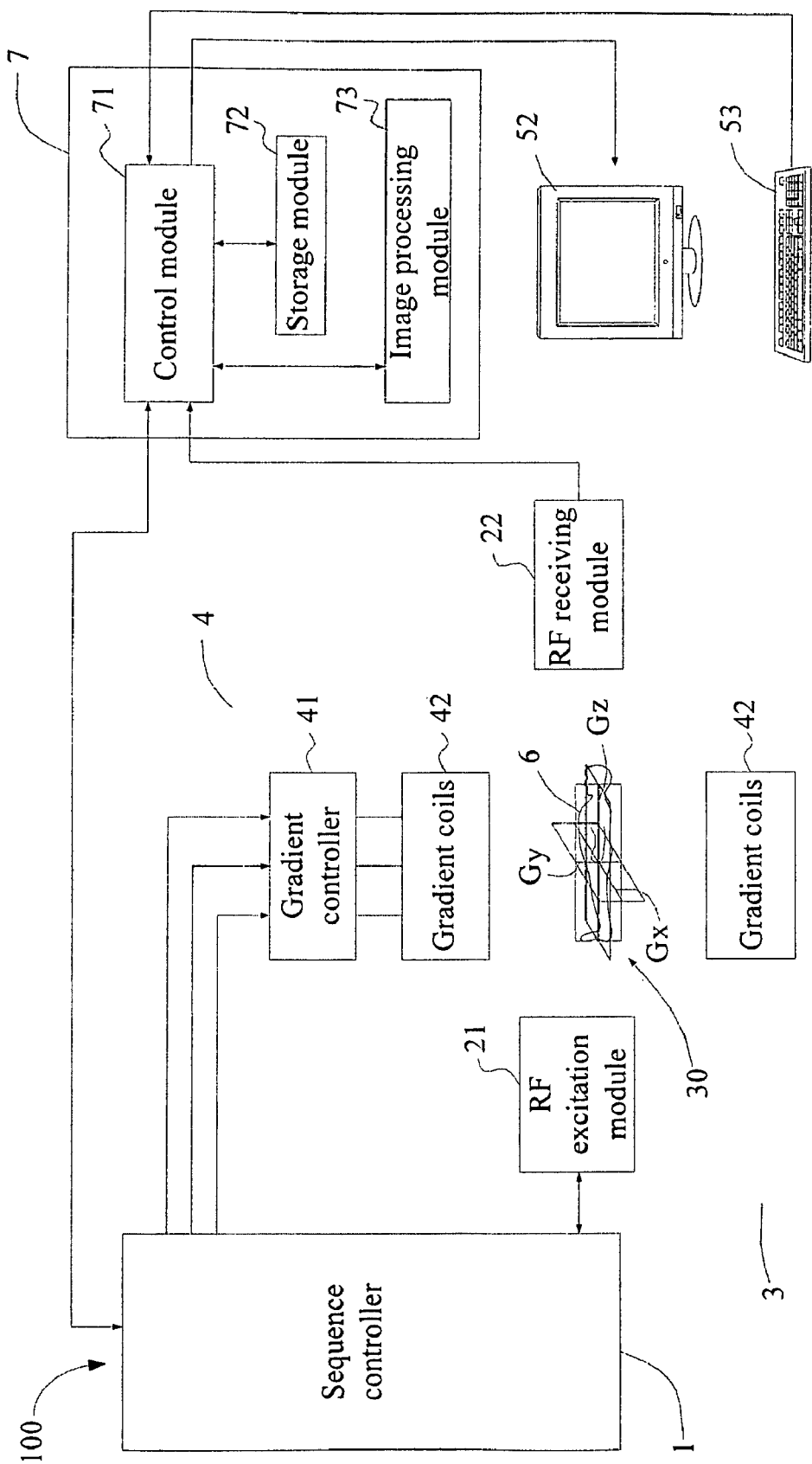
FIG. 3 is a block diagram illustrating an example of the inventive apparatus for simultaneously acquiring multi-slice MRI signals, wherein the apparatus is capable of imaging in accordance with one embodiment.

1. Apparatus:

FIG. 3 is a diagram illustrating an example apparatus 100 for acquiring multi-slicer slab MRI signals in accordance with one embodiment.

Referring to FIG. 3, the imaging apparatus 100 comprises a sequence controller 1, an RF excitation module 21 for emitting an excited waveform, an RF receiving module 22 for receiving MR image signals, a static magnetic field output module 3, a gradient output module 4, a main console 7, a display device 52, and an input device 53. The RF excitation module 21 and the RF receiving module 22 can each be an RF coil with either a single channel or multiple channels. The gradient output module 4 can be provided with a gradient controller 41 and a plurality of gradient coils 42. The main console 7 has a control module 71, a storage module 72, and an image processing module 73.

A subject 6 can be positioned within a measurement space 30. In the measurement space 30, there are a uniform magnetic field generated by the static magnetic field output module 3 and a gradient generated by the gradient coils 42, which is under the control of the gradient controller 41. The uniform magnetic field cooperating with the gradient is used for the subject 6 to generate the magnetization as a source of the MRI signal.

Figure 4:
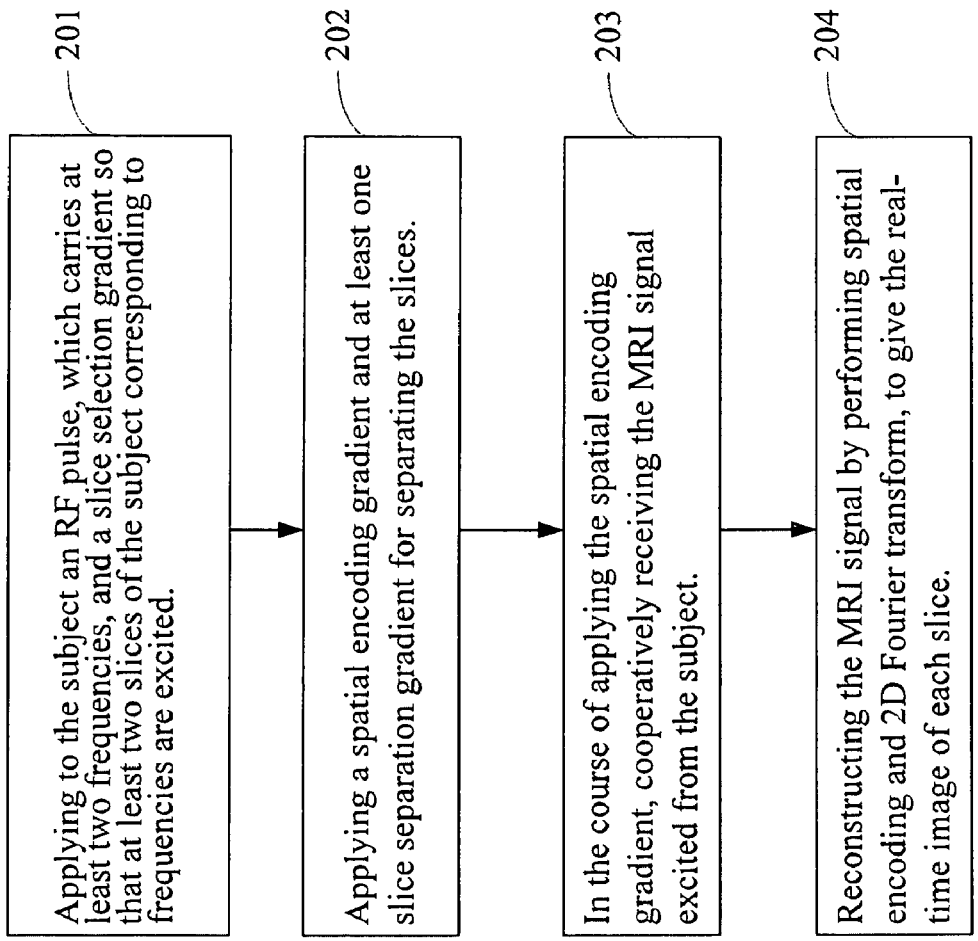
FIG. 4 is a flow chart illustrating an example method for simultaneously acquiring multi-slice MRI signals, wherein the apparatus is capable of imaging in accordance with one embodiment.

2. Methods for Imaging Using the Above Apparatus:

a. 2D MRI:

FIG. 4 is a flowchart illustrating an example method for simultaneously acquiring multi-slice MRI signals from a subject in accordance with one embodiment.

Referring to FIG. 3 and FIG. 4, in step 201, the RF excitation module 21 applies to the subject 6 one or more RF pulses, which carries at least two frequency components, and a slice selection gradient so that at least two slices of the subject 6 respectively corresponding to the at least two frequency components are excited simultaneously.

For example, the RF pulse 101 carrying frequencies $f_1$ and $f_2$ for exciting two slices has $f_1$ and $f_2$ designed to have a frequency difference $f_{sep}$ such that $$f_{sep} = d_{sep} \times \gamma \times G_{ss}. \quad \text{(Eq. 2)}$$

$d_{sep}$ denotes the absolute distance (in centimeters) between the two adjacent slices that correspond to the two frequencies, wherein two adjacent slices mean two neighboring slices excited by a plurality of frequencies carried by an RF pulse. $\gamma$ denotes the atomic gyromagnetic ratio. $G_{ss}$ denotes the intensity of the slice-selection gradient (in Gauss/centimeter).

In step 202, the gradient output module 4 applies to the subject 6 a spatial encoding gradient $G_{spen}$ and at least one slice separation gradient $G_{sep}$ for separating at least two slices, wherein the spatial encoding gradient $G_{spen}$ comprises a phase-encoding gradient $G_Y$ and a frequency-encoding gradient $G_X$.

The ratio of $G_{sep}$ to $G_{spen}$, which may be the phase-encoding gradient $G_Y$ or the frequency-encoding gradient $G_X$ and cooperates with $G_{sep}$ to receive MRI signals, should meet a relation as follows:

$$G_{sep}/G_{spen} \geqq FOV_{spen}/d_{sep}. \quad \text{(Eq. 3)}$$

$FOV_{spen}$ denotes a field (e.g. width) (in centimeters) of view along the direction of the spatial encoding gradient $G_{spen}$. $d_{sep}$ denotes the absolute distance (in centimeters) between the two adjacent slices that correspond to the two frequencies. The two adjacent slices can be separated completely as held by Eq. 3.

In step 203, the gradient output module 4, in the course of applying the spatial encoding gradient (phase-encoding gradient $G_Y$ and a frequency-encoding gradient $G_X$), cooperates with the RF receiving module 22 to receive the MRI signals excited from the subject 6.

In step 204, the MRI signal is reconstructed by performing spatial encoding and 2D Fourier transform, so as to give the real-time image of each slice.

b. 3D MRI:

The difference between 3D MRI and 2D MRI is that in the latter, one slice is excited in one scan and then the image information is given through 2D(?) spatial encoding, whereas in the former one slab is excited in one scan and then the image information is given through 3D spatial encoding.

Figure 5:
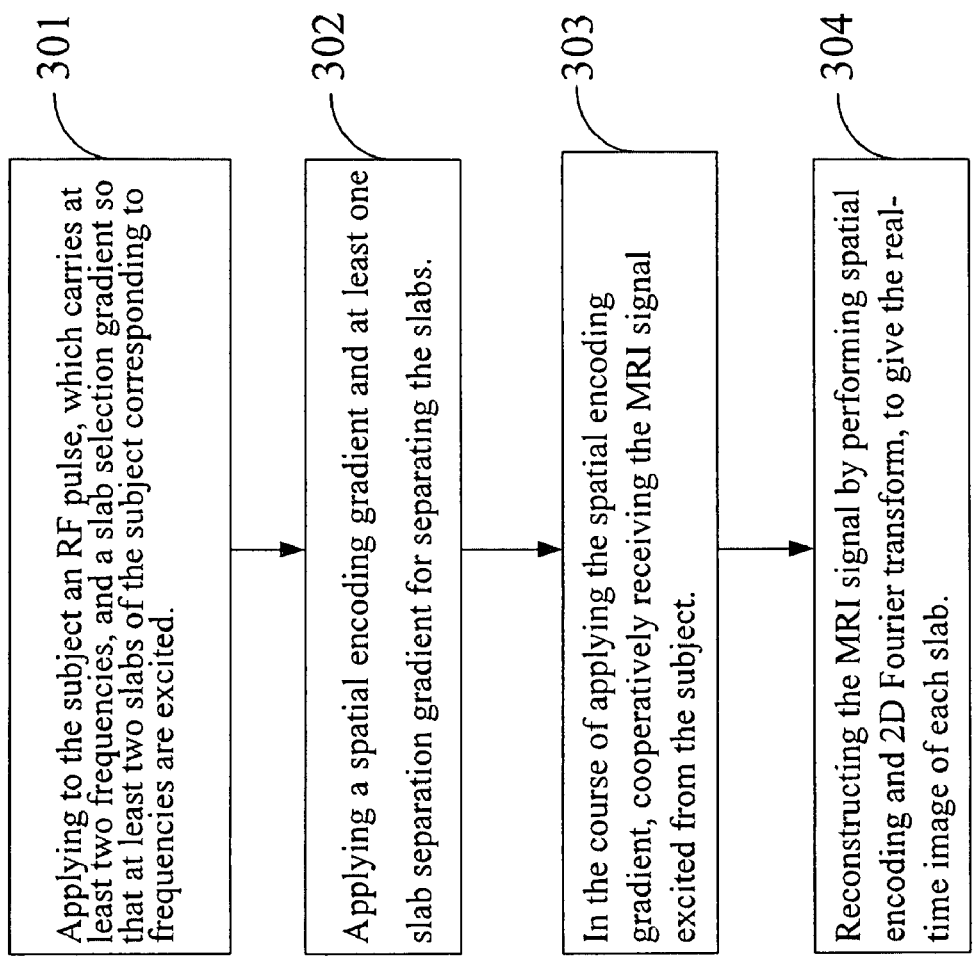
FIG. 5 is a flow chart illustrating an example method for simultaneously acquiring multi-slab MRI signals, wherein the apparatus is capable of imaging in accordance with another embodiment.

FIG. 5 is a flowchart illustrating an example method for 3D MRI in accordance with one embodiment.

Referring to FIG. 3 and FIG. 5, in step 301, the RF excitation module 21 applies to the subject 6 one or more than one RF pulse, which carries at least two frequency components, and a slab selection gradient so that at least two slabs of the subject 6 respectively corresponding to the at least two frequency components are excited simultaneously.

For example, the RF pulse 101 carrying frequencies $f_1$ and $f_2$ for exciting two slabs has $f_1$ and $f_2$ designed to have a frequency difference $f_{sep}$ as held by Eq. 2.

In step 302, the gradient output module 4 applies to the subject 6 a spatial encoding gradient $G_{spen}$ and at least one slab separation gradient $G_{sep}$ for separating the at least two slabs, wherein the spatial encoding gradient $G_{spen}$ comprises a phase-encoding gradient $G_Y$, a frequency-encoding gradient $G_X$, and a slab-selection gradient $G_Z$.

The ratio of $G_{sep}$ to $G_{spen}$ should obey Eq. 3 which may be the phase-encoding gradient $G_Y$, the frequency-encoding gradient $G_X$ or the slab-selection gradient $G_Z$ and cooperates with $G_{sep}$ to receive MRI signals.

In step 303, the gradient output module 4, in the course of applying the spatial encoding gradient, cooperates with the RF receiving module 22 to receive the MRI signals excited from the subject 6.

In step 304, the MRI signal is reconstructed by performing spatial encoding and 3D Fourier transform, so as to give the real-time image of each slab.

Figure 6:
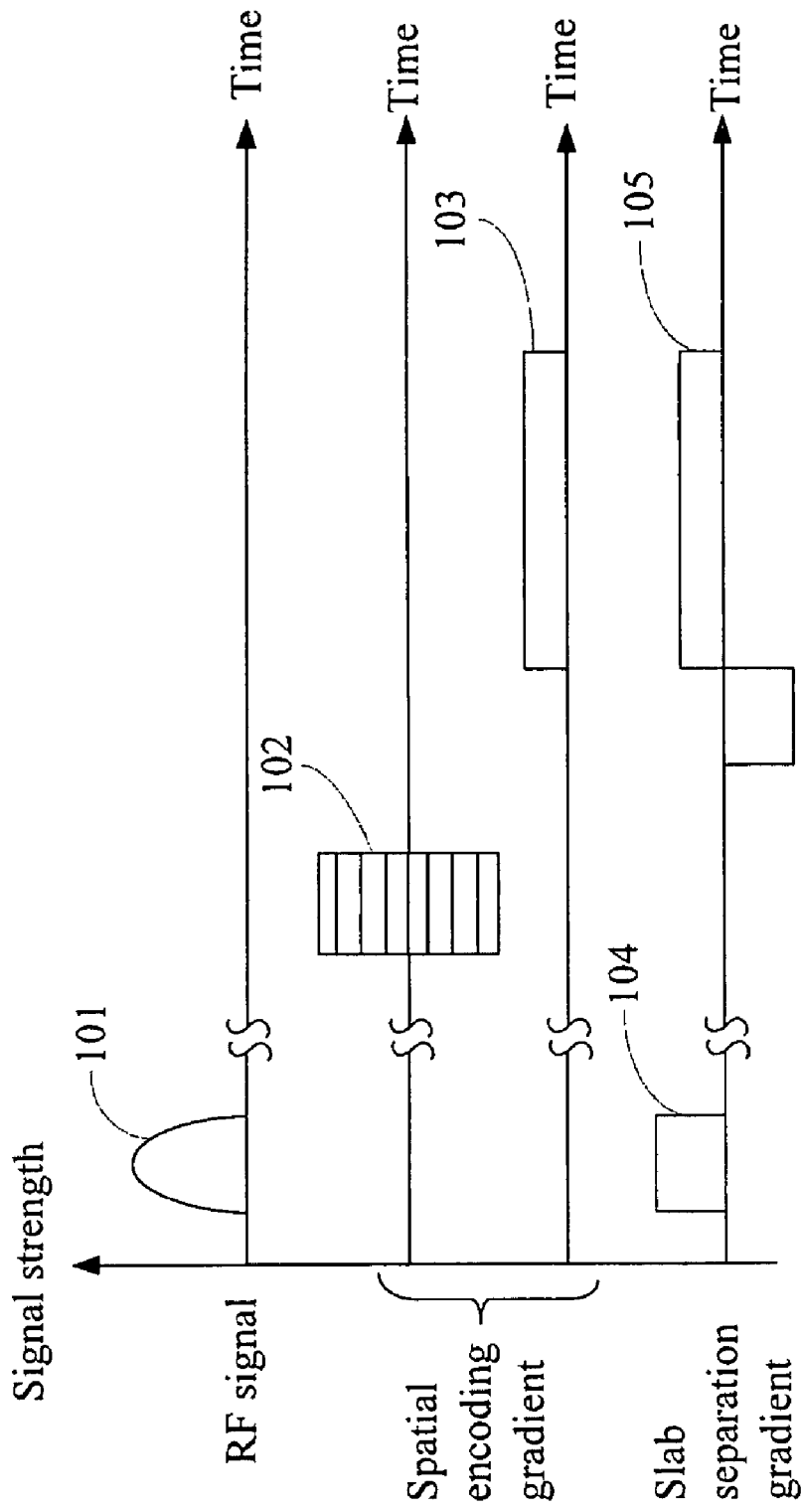
FIG. 6 is a timing sequence diagram, showing the timing sequence of control of the method for simultaneously acquiring multi-slice MRI signals of FIG. 4.

3. Control Procedure:

a. 2D MRI:

FIG. 6 is a timing diagram illustrating control of the system of FIG. 3 when implementing the process of FIG. 4.

Referring to FIG. 3 and FIG. 6, the controller module 71 can receive the control instructions sent by the user from the input device 53 and cooperates with a preset program stored in the storage module 72 to make the sequence controller 1 execute the method of FIG. 4.

The sequence controller 1 can be configured to output driving signals to drive the activation of the RF excitation module 21, the RF receiving module 22 and the gradient output module 4, wherein the steps of controlling, in accordance with one embodiment, are as follows.

i. The sequence controller 1 drives the RF excitation module 21 to generate to the subject 6 one or more than one RF pulse 101 that carries at least two frequency components. For example, the RF pulse 101 carries frequencies $f_1$ and $f_2$, which have a difference $f_{sep}$ meeting Eq. 2. Yet, the sequence controller 1 drives the gradient controller 41 to control the gradient coils 42 for generating the slice-selection gradient $G_{ss}$ 104.

ii. The sequence controller 1 applies a spatial encoding gradient $G_{spen}$ to the subject 6, with respect to each encoding direction for each slice.

iii. The sequence controller 1 drives the gradient controller 41 to control the plurality of gradient coils 42 for generating to the subject 6 at least one slice separation gradient $G_{sep}$ 105.

In this example, the spatial encoding gradient $G_{spen}$ comprises a phase-encoding gradient 102 and a frequency-encoding gradient 103 and, in the course of applying the spatial encoding gradient $G_{spen}$, at least one slice separation gradient $G_{sep}$ 105 is applied while the MRI signals excited from the subject 6 are received. The ratio of $G_{sep}$ 105 to $G_{spen}$, which cooperates with $G_{sep}$ to receive the MRI signals, should meet Eq. 3 so that two adjacent slices can be separated completely.

Figure 7:
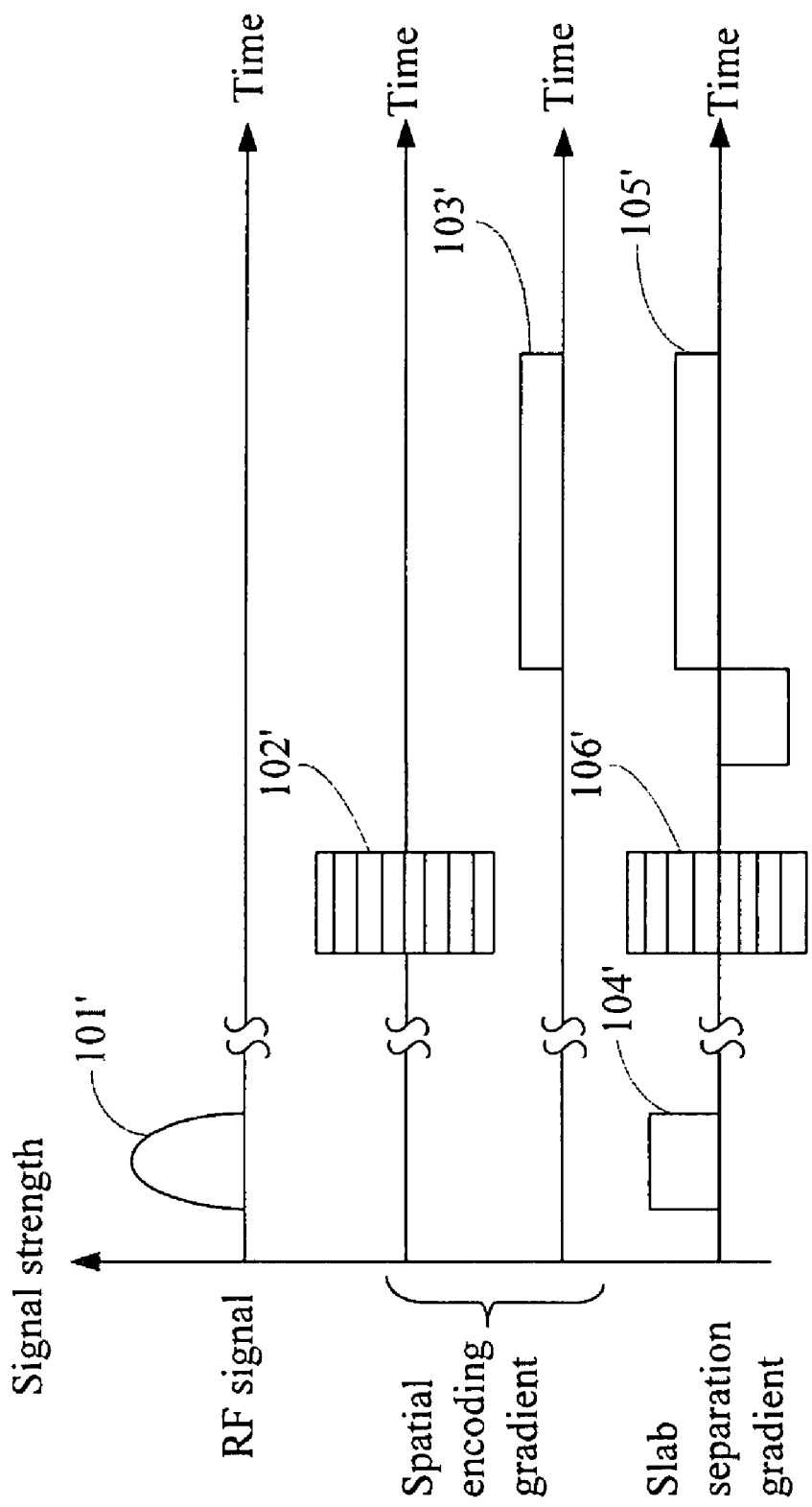
FIG. 7 is a timing sequence diagram also showing the timing sequence of control of the method for simultaneously acquiring multi-slab MRI signals of FIG. 5.

Depending on the embodiment, the receiving module 22 can receive the MRI signals excited from the subject 6 while the frequency-encoding gradient 103 and the at least one slice separation gradient 105 are applied. The MRI signals can then be reconstructed by the image processing module 73 performing transformation such as spatial encoding and 2D Fourier transform, so as to give the real-time image data of the slices. The reconstructed data, which are the images of the separated slices, can then be output to be displayed on a display device 52.

b. 3D MRI:

FIG. 7 is a timing chart illustrating control of the system of FIG. 3 when implementing the process of FIG. 5.

Referring to FIG. 3 and FIG. 7, the sequence controller 1 can be configured to output driving signals to drive and control the activation of the RF excitation module 21, the RF receiving module 22 and the gradient output module 4, wherein the steps of controlling in accordance with one embodiment are as follows.

i. The sequence controller 1 drives the RF excitation module 21 to generate to the subject 6 one or more than one RF pulse 101 that carries at least two frequency components; for example, the RF pulse 101 carries frequencies $f_1$ and $f_2$, which have a difference $f_{sep}$ meeting Eq. 2. Yet, the sequence controller 1 drives the gradient controller 41 to control the gradient coils 42 for generating the slab-selection gradient $G_{ss}$ 104.

ii. The sequence controller 1 applies a spatial encoding gradient $G_{spen}$ to the subject 6, with respect to each encoding direction for each slab.

iii. The sequence controller 1 drives the gradient controller 41 to control the plurality of gradient coils 42 for generating to the subject 6 at least one slab separation gradient $G_{sep}$ 105.

In this example, the spatial encoding gradient $G_{spen}$ comprises a phase-encoding gradient 102, a frequency-encoding gradient 103 and a slab-selection gradient 106. In the course of applying the spatial encoding gradient $G_{spen}$, at least one slab separation gradient $G_{sep}$ 105 is applied while the MRI excited signals from the subject 6 are received. The ratio of $G_{sep}$ 105 to $G_{spen}$, which cooperates with $G_{sep}$ to receive the MRI signals, should meet Eq. 3 so that two adjacent slabs can be separated completely.

Depending on the embodiment, the receiving module 22 can receive the MRI signals excited from the subject 6 while the frequency-encoding gradient 103 and at least one slab separation gradient 105 are applied. The MRI signals can then be reconstructed by the image processing module 73 performing spatial encoding and transformation such as 3D Fourier transform, so as to give the real-time image data of the slabs. The reconstructed data, which is the images of the separated slabs, can then be output to be displayed on a display device 52.

Figure 8A:
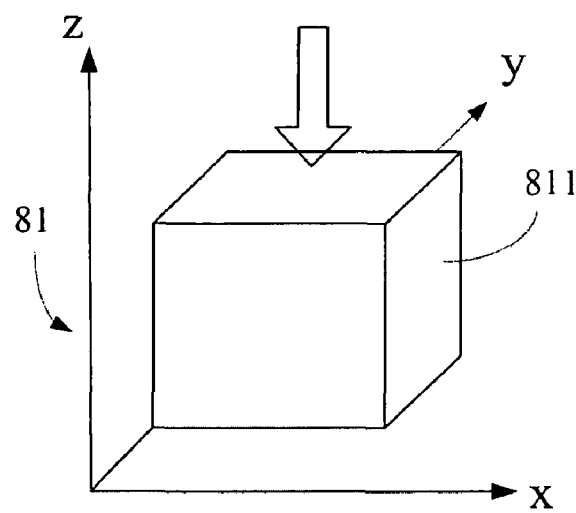
FIGS. 8A-C is a schematic diagram, showing that a MRI image obtained using the system of FIG. 3 and the methods described herein has each pixel thereof resulting from the protection of a cubic voxel in the Z-direction.
Figure 8B:
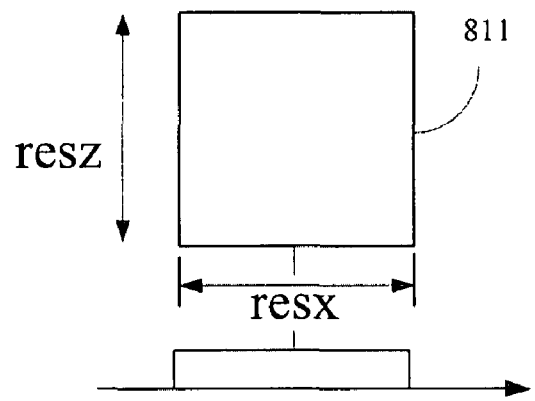
Figure 8C:
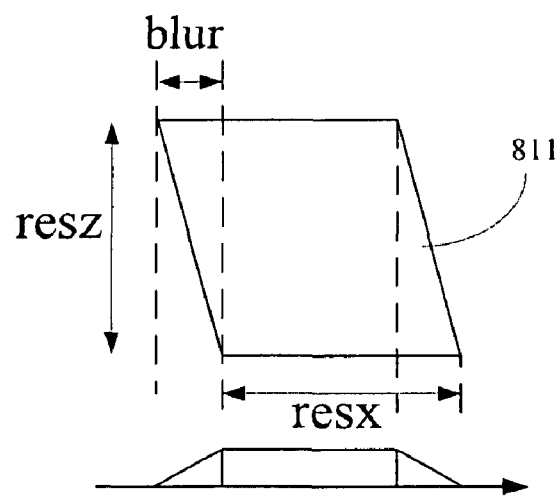

4. Reduction of Blur to Give a Sharp Image:

a. Cause of Image Blur:

Referring to FIG. 8(A) and FIG. 8(B), the MRI image has each pixel thereof resulting from the protection of a cubic voxel 81 in the Z-direction. Ideally, the projection of the voxel 81 should result in a square 811; thus, the X-direction resolution "resx" may have sharp edges. Referring to FIG. 8(C), when the slice/slab separation gradient 105 (as shown in FIG. 6) or 105 (as shown in FIG. 7) is turned on to separate two images, the projection can present a parallelogram 812 as a result of some shear strain. Thus, the "resx" does not have sharp edges, causing the projected image to be blurred.

b. Method for Overcoming Image Blur:

General equations for calculating the image blur are as follows.

$$\text{blur(mm)} = \text{res}_Z \times G_Z / G_X, \quad \text{(Eq. 4-1)}$$

$$\text{blur(pixel)} = \text{blur(mm)} / \text{res}_X. \quad \text{(Eq. 4-2)}$$

When Eq. 4-1 and Eq. 4-2 are applied to 2D MRI, $\text{res}_Z$ denotes the thickness of one slice, $\text{res}_X$ denotes the resolution in the X-direction, $G_Z$ denotes the slice-selection gradient, and $G_X$ frequency-encoding gradient.

When Eq. 4-1 and Eq. 4-2 are applied to 3D MRI, the only difference lies in that $\text{res}_Z$ denotes the ratio of the thickness of the slab to the number of spatial encoding in the Z-direction. The other parameters are the same as those for 2D MRI.

Now set forth Eq. 3 again, which describes the criterion for complete separation of two adjacent slices/slabs.

$$G_{sep}/G_{spen} \geq \text{FOV}_{spen}/d_{sep} \quad \text{(Eq. 3)}$$

With the appropriate substitutions, Eq. 3 can be combined with Eq. 4-1 and Eq. 4-2 so that;

$$\text{res}_Z = [\text{blur(pixel)} \times d_{sep} \times \text{res}_X]/\text{FOV}_X, \quad \text{(Eq. 5)}$$

where $\text{res}_Z$ denotes the resolution of the image in the Z-direction, blur is the degree of image blur (in unit of pixel), $d_{sep}$ denotes the absolute distance between the two adjacent slices/slabs, $\text{res}_X$ denotes the resolution in the X-direction, and $\text{FOV}_{spen}$ denotes a field (e.g. width) of view along the direction of the spatial encoding gradient.

According to Eq. 5, the blur is required to be set in a preset range so that a sharp, unblurred, image may be given. The following is an example, which illustrates how to set the imaging conditions into practice. Assume the imaging conditions to be as follows: blur=3 pixels; $d_{sep}$=1.67 cm; $\text{res}_X$=1 mm; $\text{FOV}_{spen}$=10 mm. Replacing these parameter values in Eq. 5, one has that $\text{res}_Z$=0.5 mm. In other words, $\text{res}_Z$ must be determined to be less than 0.5 mm so that a sharp image can be given.

The preset blur can be set according to practical needs. For example, there is no change in the quality of image as the blur is less than 1 pixel, and therefore the image is of very good quality. The change is difficult to view from the naked eye as the blur is in the range of 1-3 pixels; making an image of good quality. When the blur is 3 pixels up to 6 pixels, the quality of image is of poor quality. When the blur is more than 6 pixels, the quality of the image is bad and many features become hard to determine. Nevertheless, adjustment may be made according to various needs since different blurs may find their uses in different situations.

For example, with the imaging conditions set forth above, the resultant images of a SMA series gives inevitable blur due to the additional applied gradients, whereas the techniques described herein reduce the blur and therefore a sharp image of the slice/slab is acquired simultaneously.

Figure 9A:
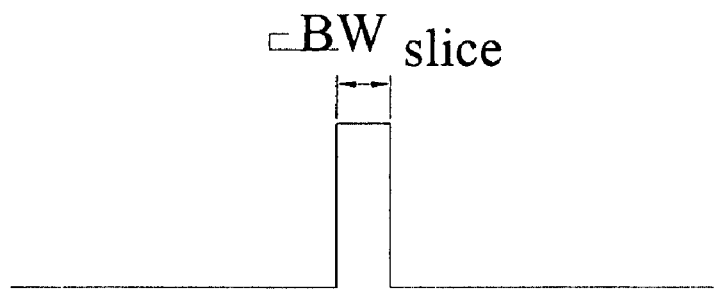
FIG. 9A is a waveform diagram, showing the bandwidths of a single excitation frequency.
Figure 9B:
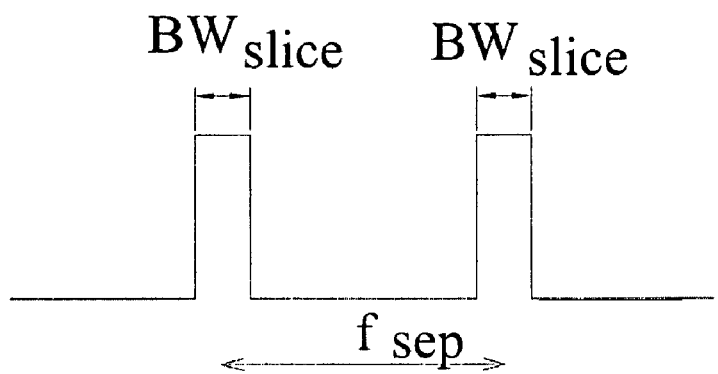
FIG. 9B is a waveform diagram, showing the bandwidths of multi-slice excitation frequencies for the system of FIG. 3 and the methods described herein.
Figures 10A, 10B:
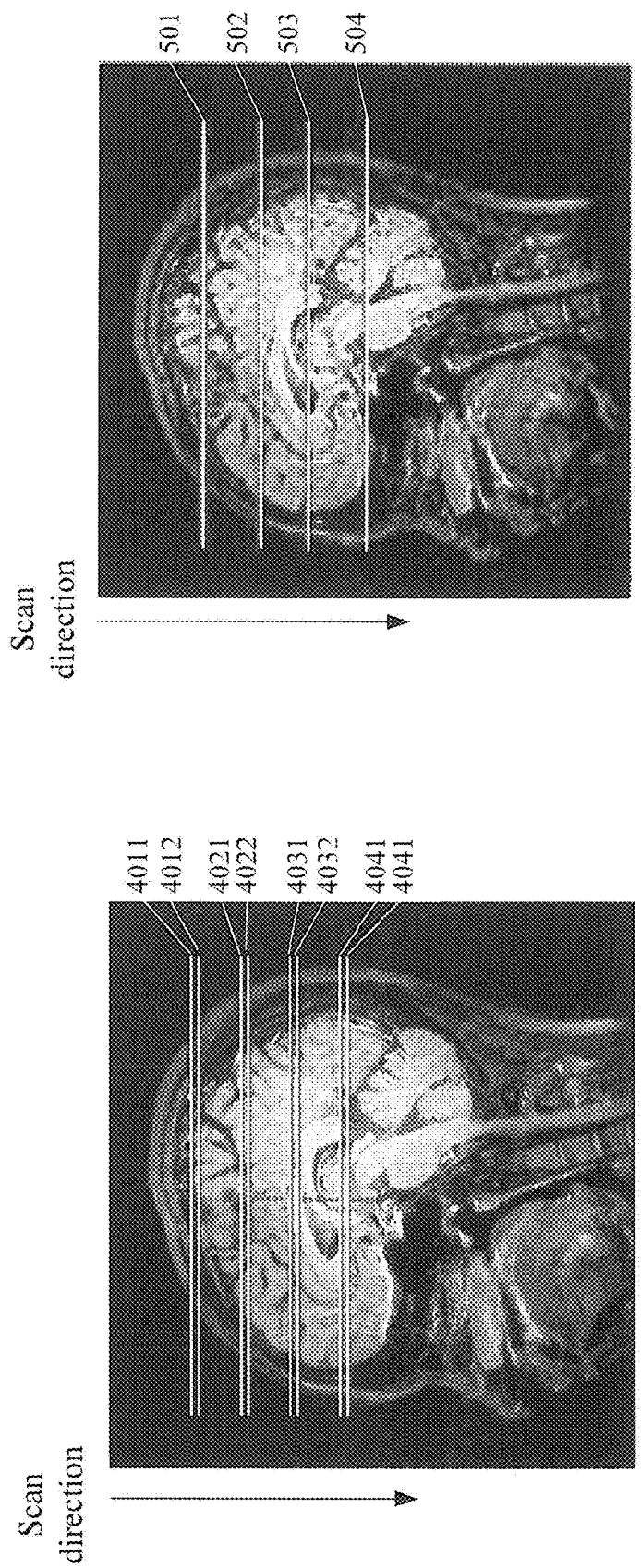
FIG. 10A is a schematic diagram showing an embodiment in which four slices of the subject can be excited by multiple frequencies using the system of FIG. 3 and the methods described herein.
FIG. 10B is a schematic diagram showing an embodiment in which four slabs of the subject can be excited by multiple frequencies using the system of FIG. 3 and the methods described herein.

5. Experimental Results:

Referring to FIG. 9(A) and FIG. 9(B), a description is made with respect to the bandwidth of the excitation frequency. In comparison with the conventionally used RF pulse with a bandwidth $BW_{slice}$ having one single frequency, which is lower than 10 kHz and is in the range of about 1 kHz and about 5 kHz, the RF pulse carrying at least two frequencies adopted in the present invention has the central frequencies, with respect to two adjacent slices, differing from each other by ($f_{sep}$) 20 kHz or more. Referring to FIG. 10(A), an embodiment is described in which 4 slices 401n through 404n of a subject are excited at a time and, as shown, an image of 12 slices are given through 3 series of excitations. Two adjacent slices 4011 and 4021 are those excited by the two frequencies carried by the RF pulse. Referring to FIG. 10(B), another embodiment of the present invention is described in which the RF pulse has multiple excitation frequencies and 4 slabs 501 through 504 of a subject are excited.

Figure 11:
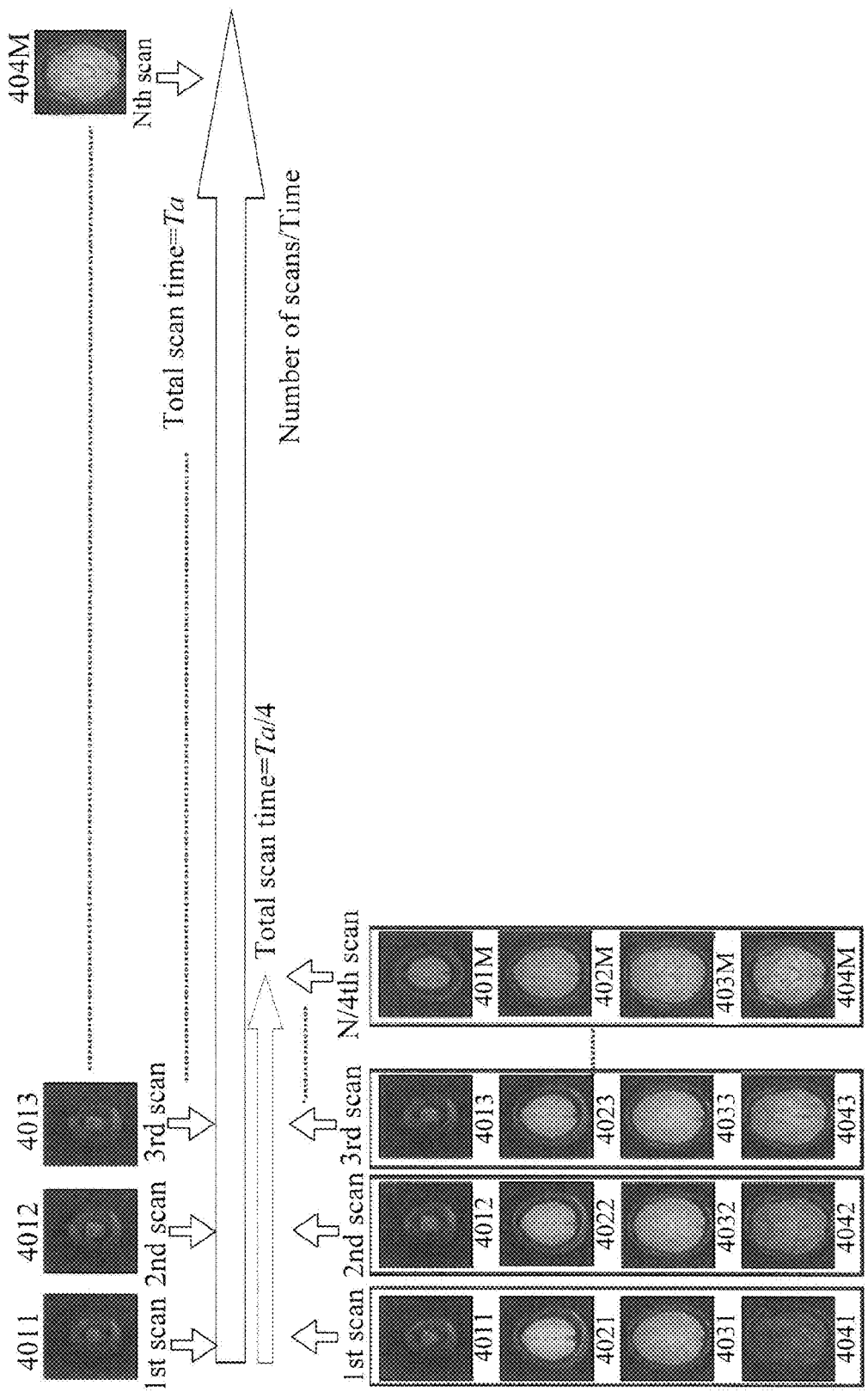
FIG. 11 is a schematic diagram showing that multiple slices of the subject can be excited at a time and only a scan time Ta/4 is required for acquiring N images using the system of FIG. 3 and the methods described herein.

Referring to FIG. 11, a description is made with respect to the imaging speed. In conventional 2D MRI, acquisition of N images takes a scan time Ta; it is very time consuming. According to the embodiments described herein, multiple slices of a subject can be excited at a time so that acquisition of N slice images takes only a scan time, say, Ta/4. For acquisition of totally 256 slice image images, each scan along the imaging direction can give 4 slice images when an RF pulse carrying 4 frequencies is used to excite 4 slices 401 through 404 of the subject, as shown in FIG. 10(A). The nth scan can give another 4 slice images 401n through 404n since those slices are simultaneously excited. Therefore, just N/4 scans can give N slice images. In other word, M scans can give 4M slice images, assuming that N=4M. The methods described herein require only 64 scans for a total of 256 slice images. Thus, the time consumed for imaging can be cut down to one forth; in practice this embodiment decreases the time from about 54 minutes to about 14 minutes.

Figure 12:
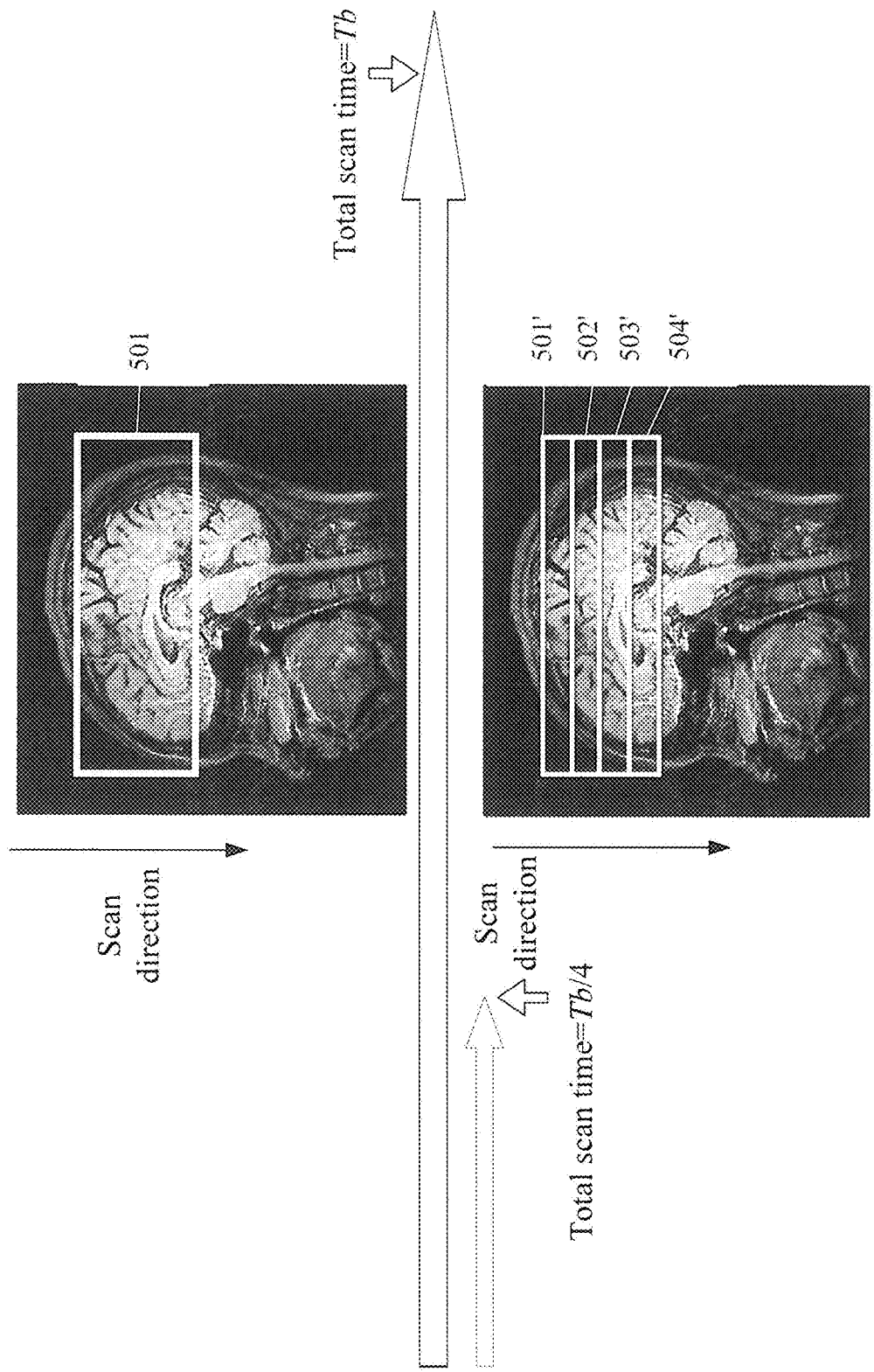
FIG. 12 is a schematic diagram showing that multiple slabs of the subject can be excited at a time and only a scan time Tb/4 is required for acquiring N images using the system of FIG. 3 and the methods described herein.

Similarly, referring to FIG. 12, a comparison is made with conventional processes in which a scan time Ta is required for exciting a whole slab 501 at a time to give the images of all the slices. When the whole slab 501 is taken as a combination of 4 slabs 501 through 504, an RF pulse carrying 4 frequencies can be used to excite the 4 slabs 501 through 504 of the subject. It requires only a scan time Tb/4 for acquiring the whole slab 501. Thus, the time required for acquiring all the images can be greatly decreased.

Figure 13A:
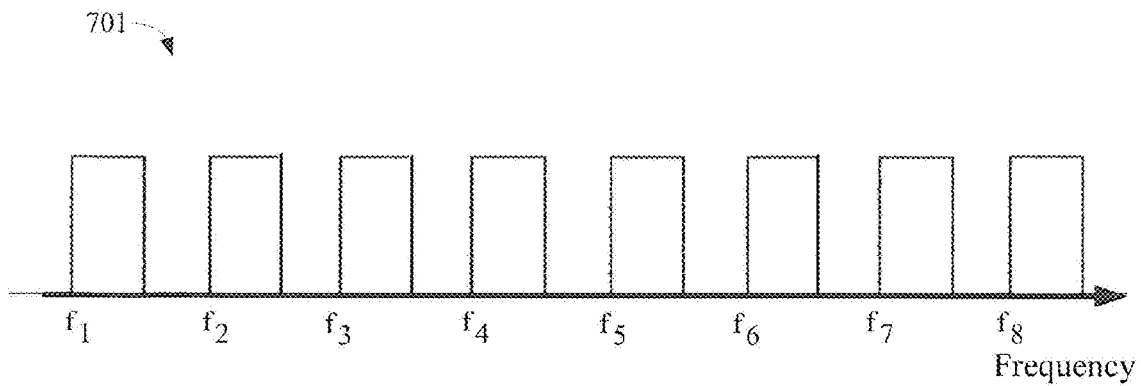
FIG. 13 is a schematic diagram showing that the system of FIG. 3 and the methods described herein can simultaneously give a MRI signal from eight slices.
Figure 13B:
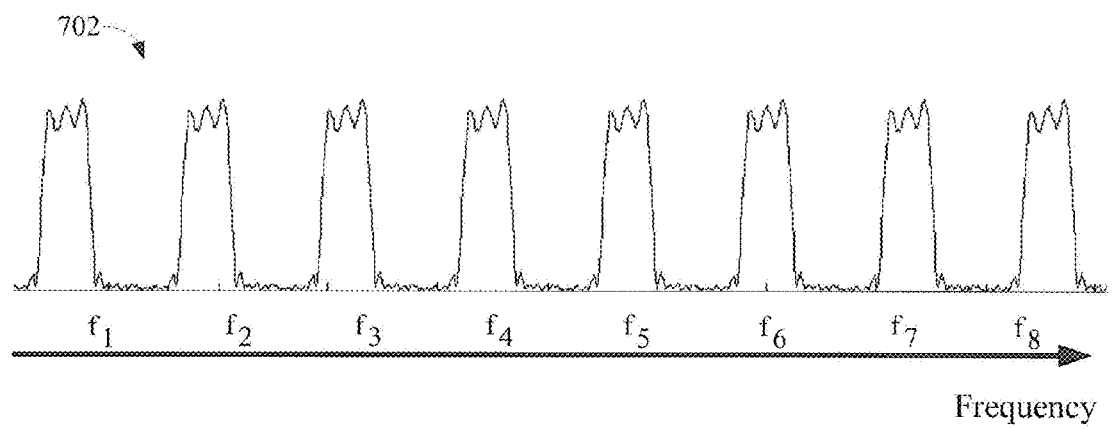
Figure 13C:
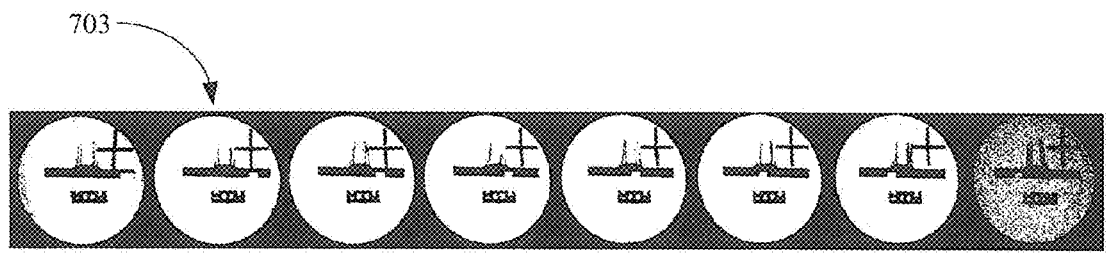

Simultaneous acquisition of a MRI signal from 8 slices is possible, as well as 2 slices and 4 slices described above. As shown in FIG. 13(A), an RF excitation signal 701 due to an RF excitation with 8 frequencies is distributed in the frequency domain, wherein the signal 701 is sent from the RF excitation module 21. As shown in FIG. 13(B), a multi-slice MRI signal 702 with respect to the RF excitation signal 701 is distributed in the frequency domain, wherein the multi-slice MRI signal 702 is received by the RF receiving module 22. As validated in FIG. 13(C), the received multi-slice MRI signal 702 is processed to give a MR image 703 that comprises the simultaneously acquired MRI signal from 8 slices.

Thus, the systems and methods described herein can provide the following:

1. High imaging speed: The systems and methods described herein can be used to simultaneously excite and acquire multiple MR images of different locations in the subject. Thus, they can save the time for imaging of MRI systems.

2. High compatibility: The systems and methods described herein are compatible with a variety of existing MRI systems. Moreover, they do not require extra coils/RF channels and extra time for computation of image information and extra computer equipment. Thus, the systems and methods described herein can promote the efficiency of MRI systems.

3. High image sharpness: The systems and methods described herein can be used to simultaneously give multiple sharp images by utilizing techniques of high-resolution slice/slab acquisition.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A method for simultaneously acquiring multi-slice/slab MRI signals from a subject, the method comprising steps of:
    setting a degree of image blur within a preset range;
    determining image resolution in a first direction according to the degree of the image blur, the absolute distance between the two adjacent slices/slabs, image resolution in a second direction, and a field of view along the direction of the second direction;
    applying one or more than one RF pulse, which carries at least two frequency components, and a slice/slab selection gradient so that at least two slices/slabs of the subject respectively corresponding to the at least two frequency components are excited simultaneously;
    applying a spatial encoding gradient; and
    applying a slice/slab separation gradient for separating the at least two slices/slabs,
    thereby a sharp image of the subject can be shown through a MRI apparatus.

2. The method according to claim 1, wherein the determination of the resolution of the image step is realized according to an equation:

$$res_z = [blur \times d_{sep} \times res_{spen}]/FOV_{spen},$$

where $res_z$ denotes the image resolution in the first direction, blur is the degree of the image blur, $d_{sep}$ denotes the absolute distance between the two adjacent slices/slabs, $res_{spen}$ denotes the image resolution in the second direction, and $FOV_{spen}$ denotes the field of view along the second direction.

3. The method according to claim 1, wherein the spatial encoding gradient comprises a phase-encoding gradient and a frequency-encoding gradient.

4. The method according to claim 1, wherein the spatial encoding gradient in the method for acquiring multi-slab MRI signals comprises a phase-encoding gradient, a frequency-encoding gradient, and a slab-selection gradient.

5. The method according to claim 1, further comprising the step of:
  applying the slice/slab separation gradient in the course of applying the spatial encoding gradient, and receiving the MRI signals excited from the subject to be used for spatial encoding.

6. The method according to claim 1, wherein the RF pulse has a frequency difference $f_{sep}$ between central frequencies for the two adjacent slices/slabs such that $$f_{sep} = d_{sep} \times \gamma \times G_{ss},$$

where $d_{sep}$ denotes the absolute distance between the two adjacent slices/slabs, $\gamma$ denotes the atomic gyromagnetic ratio, and $G_{ss}$, denotes the slice/slab-selection gradient.

7. The method according to claim 1, further comprising determining the slice/slab separation gradient according to the spatial encoding gradient, a field of view along the direction of the spatial encoding gradient, and the absolute distance between the two adjacent slices/slabs.

8. The method according to claim 7, wherein the slices/slabs separation gradient is determined according to an equation:

$$G_{sep}/G_{spen} \geq FOV_{spen}/d_{sep},$$

where $G_{sep}$ denotes the slices/slabs separation gradient, $G_{spen}$ denotes the spatial encoding gradient that cooperates with $G_{sep}$ to simultaneously receive MRI signals, $FOV_{spen}$ denotes the field of view along the direction of the spatial encoding gradient, and $d_{sep}$ denotes the absolute distance between the two adjacent slices/slabs.

9. The method according to claim 1, wherein the method is applicable to MRI systems.

10. The method according to claim 1, further comprising:
  receiving the MRI signal excited from the subject; and
  reconstructing the MRI signal by performing spatial encoding and transformation, so as to give a real-time image of each slice/slab.

11. An apparatus for simultaneously acquiring multi-slice/slab MRI images from a subject, the apparatus being capable of imaging by generating a MRI signal from the subject and by reducing the MRI signal to spatial encoding data with respect to each slice/slab of the subject, the apparatus comprising:
  an RF excitation module, being controlled for applying to the subject one or more than one RF pulse, which carries at least two frequencies, so that at least two slices/slabs of the subject respectively corresponding to the at least two frequency components are excited simultaneously; and
  a gradient output module, being controlled for applying to the subject a spatial encoding gradient, a slice/slab selection gradient, and a slice/slab separation gradient for separating the at least two slices/slabs;
  wherein the resolution of the MRI images in a first direction is determined according to the degree of image blur that is set within a preset range, the absolute distance between the two adjacent slices/slabs, the resolution of the MRI images in a second direction, and a field of view along the second direction.

12. The apparatus of claim 11, further comprising:
  an RF receiving module, being controlled for receiving the MRI signal excited from the subject; and
  a sequence controller configured to control the RF excitation module, the gradient output module and the RF receiving module.

13. The apparatus according to claim 12, wherein the sequence controller, in the course of applying the spatial encoding gradient, is configured to control the application of the slice/slab separation gradient and the reception of the MRI signals excited from the subject to be used for spatial encoding.

14. The apparatus according to claim 11, wherein the resolution of the MRI images in a first direction is determined according an equation:

$$res_z = [blur \times d_{sep} \times res_{spen}]/FOV_{spen},$$

where $res_z$ denotes the resolution of the MRI images in the first direction, blur is the degree of the image blur, $d_{sep}$ denotes the absolute distance between the two adjacent slices/slabs, $res_{spen}$ denotes the resolution of the MRI images in the second direction, and $FOV_{spen}$ denotes a field of view along the second direction.

15. The apparatus according to claim 11, wherein the spatial encoding gradient comprises a phase-encoding gradient and a frequency-encoding gradient.

16. The apparatus according to claim 11, wherein the spatial encoding gradient comprises a phase-encoding gradient, a frequency-encoding gradient, and a slab-selection gradient.

17. The apparatus according to claim 11, wherein the RF pulse has a frequency difference $f_{sep}$ between the central frequencies for two adjacent slices/slabs such that $$f_{sep} = d_{sep} \times \gamma \times G_{ss},$$

where $d_{sep}$ denotes the absolute distance between the two adjacent slices/slabs, $\gamma$ denotes the atomic gyromagnetic ratio, and $G_{ss}$, denotes the slice-election gradient.

18. The apparatus according to claim 11, wherein the gradient output module is configured to apply the slices/slabs separation gradient that is determined according to the spatial encoding gradient, a field of view along the direction of the spatial encoding gradient, and the absolute distance between the two adjacent slices/slabs.

19. The apparatus according to claim 18, wherein the slices/slabs separation gradient is determined according to an equation:

$$G_{sep}/G_{spen} \geq FOV_{spen}/d_{sep},$$

where $G_{sep}$ denotes the slices/slabs separation gradient, $G_{spen}$ denotes the spatial encoding gradient, $FOV_{spen}$ denotes the field of view along the direction of the spatial encoding gradient, and $d_{sep}$ denotes the absolute distance between the two adjacent slices/slabs.

* * * * *